United States Patent
Maejima

(10) Patent No.: US 6,956,431 B2
(45) Date of Patent: Oct. 18, 2005

(54) PULSE WIDTH MODULATION AMPLIFIER

(75) Inventor: Toshio Maejima, Iwata (JP)

(73) Assignee: Yamaha Corporation, Santa Clara, CA (US)

( * ) Notice: Subject to any disclaimer, the term of this patent is extended or adjusted under 35 U.S.C. 154(b) by 8 days.

(21) Appl. No.: 10/787,285

(22) Filed: Feb. 26, 2004

(65) Prior Publication Data

US 2004/0169553 A1 Sep. 2, 2004

(30) Foreign Application Priority Data

| Feb. 28, 2003 | (JP) | ..................................... 2003-053873 |
| Jan. 21, 2004 | (JP) | ..................................... 2004-013361 |

(51) Int. Cl.$^7$ .............................. H03F 3/38; H03K 4/06
(52) U.S. Cl. ...................... 330/10; 330/100; 330/251; 327/132; 327/137
(58) Field of Search ..................... 330/10, 100, 251; 327/132, 131, 137

(56) References Cited

U.S. PATENT DOCUMENTS

| 4,016,501 A | * | 4/1977 | Jasinski et al. ............... 330/10 |
| 4,786,863 A | * | 11/1988 | Milkovic ..................... 330/9 |
| 4,952,884 A | | 8/1990 | Tokumo et al. |
| 4,968,948 A | * | 11/1990 | Tokumo et al. ............... 330/10 |
| 5,451,900 A | | 9/1995 | Haga et al. |
| 6,307,431 B1 | * | 10/2001 | Botti et al. .................. 330/10 |
| 6,320,460 B1 | * | 11/2001 | Meszlenyi ................... 330/10 |
| 6,563,376 B2 | * | 5/2003 | Fujisawa ..................... 330/10 |
| 6,778,011 B2 | * | 8/2004 | Noro et al. ................... 330/10 |
| 6,791,405 B2 | * | 9/2004 | Tsuji et al. ................... 330/10 |

* cited by examiner

Primary Examiner—Lam T. Mai
(74) Attorney, Agent, or Firm—Pillsbury Winthrop Shaw Pittman LLP

(57) ABSTRACT

A pulse width modulation (PWM) amplifier which is capable of reducing unwanted radiation from a PWM output thereof, which can cause EMI, while reducing manufacturing costs thereof. A triangular wave-generating circuit (3) of the PWM amplifier outputs a triangular wave. The triangular wave has a waveform steep or gentle in pulse rising and falling slopes dependent on a value of current flowing through an FET (116) or an FET (117). The value of current is changed by a current flowing through a FET (112). A switching element (32) changes voltage applied to the gate of an FET (110), for control of increase and decrease in the current flowing through the FET (112). This enables the triangular wave to be generated such that it is formed by pulses having different periods. An input signal is subjected to PWM amplification based on the triangular wave generated.

8 Claims, 8 Drawing Sheets

PULSE WIDTH MODULATION AMPLIFIER

BACKGROUND OF THE INVENTION

1. Field of the Invention

The present invention relates a pulse width modulation (hereinafter also referred to as "PWM") amplifier that generates a triangular wave and performs PWM amplification of an input signal based on the triangular wave, and more particularly to a PWM amplifier configured to reduce unwanted radiation from an output signal thereof, which can cause EMI (electromagnetic interference).

2. Description of the Related Art

Conventionally, a PWM amplifier is known which generates a triangular wave and performs PWM amplification of an input signal based on the triangular wave such that unwanted radiation from an output signal, which can cause EMI, is reduced.

A PWM amplifier of this kind has been proposed e.g. by Japanese Patent Publication (Kokoku) No. H07-85524, which generates a triangular wave whose frequency has been modulated with a random signal and performs PWM amplification of an input signal based on the triangular wave, thereby reducing unwanted radiation from an output signal thereof, which can cause EMI.

For modulation of the frequency of the triangular wave with the random signal, however, the conventional PWM amplifier requires provision of not only a triangular wave-generating circuit but also a random signal-generating device (oscillator) and an FM (frequency modulation) circuit for modulating the frequency of the triangular wave with the random signal from the random signal-generating device. This results in increased manufacturing costs.

SUMMARY OF THE INVENTION

It is an object of the present invention to provide a pulse width modulation amplifier which is capable of reducing unwanted radiation from a PWM output thereof, which can cause EMI, while reducing manufacturing costs thereof.

To attain the above object, in a first aspect of the present invention, there is provided a pulse width modulation amplifier comprising an input terminal that receives a signal, a triangular wave-generating device that generates a triangular wave, a pulse width modulation amplification device that performs pulse width modulation amplification of the signal input via the input terminal based on the triangular wave generated by the triangular wave-generating device, and an output terminal that outputs the signal subjected to the pulse width modulation amplification by the pulse width modulation amplification device, wherein the triangular wave-generating device comprises an integrating device that includes an amplifier having a signal input terminal and a signal output terminal, and a capacitance element connected between the signal input terminal and the signal output terminal of the amplifier, a first constant-current device that charges the capacitance element such that an output voltage from the amplifier becomes equal to a first predetermined voltage, by causing a constant current to flow through the capacitance element in a predetermined direction, a second constant-current device that discharges the capacitance element such that the output voltage from the amplifier becomes equal to a second predetermined voltage lower than the first predetermined voltage, by causing a constant current to flow through the capacitance element in a direction opposite to the predetermined direction, a constant-current value-setting device that sets values of the constant currents caused to flow by the first and second constant-current devices, a changing device that changes the values of the constant currents set by the constant-current value-setting device, a first switching device that turns on or off to allow or block flowing of the constant current caused to flow by the first constant-current device, a second switching device that turns on or off to allow or block flowing of the constant current caused to flow by the second constant-current device, a first comparison device that compares the output voltage from the amplifier and the first predetermined voltage for outputting a signal of a logic level dependent on a result of the comparison, a second comparison device that compares the output voltage from the amplifier and the second predetermined voltage for outputting a signal of a logic level dependent on a result of the comparison, and a flip-flop that inverts a logic level of an output signal therefrom when it is detected by the first comparison device that the output voltage from the amplifier has increased to reach the first predetermined voltage, or when it is detected by the second comparison device that the output voltage from the amplifier has decreased to reach the second predetermined voltage, whereby the first and second switching devices turn on or off, depending the logic level of the output signal from the flip-flop.

With the arrangement of the pulse width modulation amplifier according to the first aspect of the present invention, a changing device is provided which changes the values of constant currents that determine pulse slopes of a triangular wave used for the pulse width modulation of an input signal, from respective values set by the constant-current value-setting device, and the changing device is realized by a simple construction. Therefore, it is possible to reduce unwanted radiation from the PWM output, which can cause EMI, while reducing manufacturing costs thereof.

Preferably, the pulse width modulation amplifier further comprises a clock pulse input terminal that receives a clock pulse externally supplied, and the constant-current value-setting device includes a phase comparison device that compares a phase of the clock pulse inputted via the clock pulse input terminal and a phase of the output signal from the flip-flop, a current-generating device that generates a current such that a direction of flow thereof and a current value thereof depend on a result of the comparison by the phase comparison device, a low-pass filter that integrates the current generated by the current-generating device, and a control device that controls the constant currents that flow from the first and second constant-current devices, according to an output from the low-pass filter.

More preferably, the changing device comprises a second capacitance element that changes a total capacitance of the low-pass filter, a third switching device that controls whether or not the second capacitance element is to be connected to the low-pass filter, a fourth switching device that controls whether or not an electric charge accumulated in the second capacitance element is to be discharged, and a D-type flip-flop that inverts a logic level of an output signal therefrom in synchronism with a rise of the output signal from the flip-flop, whereby the third and fourth switching devices turn on or off, depending on the logic level of the output signal from the D-type flip-flop.

More preferably, the changing device comprises fifth and sixth switching devices that control whether or not values of the current in first and second directions generated by the current-generating device are to be changed, and a D-type flip-flop that inverts a logic level of an output signal therefrom in synchronism with a rise of the output signal from the flip-flop, wherein the fifth and sixth switching devices turn on or off, depending on the logic level of the output signal from the D-type flip-flop.

More preferably, the control device comprises an FET having a gate thereof supplied with the output from the low-pass filter and a source thereof connected in series to the first and second resistances connected, the control device controlling a current flowing through a drain thereof according to a level of a source-gate bias thereof to thereby control the constant currents that flow from the first and second constant-current devices, and the changing device comprises a seventh switching device that controls whether or not the second resistance is to be short-circuited, and a D flip-flop that inverts a logic level of an output signal therefrom in synchronism with a rise of the output signal from the flip-flop, whereby the seventh switching device turns on or off, depending on the logic level of the output signal from the D flip-flop.

To attain the above object, in a second aspect of the present invention, there is provided a pulse width modulation amplifier comprising an input terminal that receives a signal, a triangular wave-generating device that generates a triangular wave, a pulse width modulation amplification device that performs pulse width modulation amplification of the signal input via the input terminal based on the triangular wave generated by the triangular wave-generating device, and an output terminal that outputs the signal subjected to the pulse width modulation amplification by the pulse width modulation amplification device, wherein the triangular wave-generating device comprises an integrating device that includes an amplifier having a signal input terminal and a signal output terminal, and a capacitance element connected between the signal input terminal and the signal output terminal of the amplifier, a first constant-current device that charges the capacitance element such that an output voltage from the amplifier becomes equal to a first predetermined voltage, by causing a constant current to flow through the capacitance element in a predetermined direction, a second constant-current device that discharges the capacitance element such that the output voltage from the amplifier becomes equal to a second predetermined voltage lower than the first predetermined voltage, by causing a constant current to flow through the capacitance element in a direction opposite to the predetermined direction, a constant-current value-setting device that sets values of the constant currents caused to flow by the first and second constant-current devices, a changing device that changes the respective values of the constant currents that are caused to flow through the capacitive element in the predetermined direction and the direction opposite to the predetermined direction, a first switching device that is operable when a value of the constant current caused to flow by the first constant-current device is changed by the changing device, to turn on or off to allow or block flowing of the constant current whose value has been changed, and operable when the value of the constant current caused to flow by the first constant-current device has not been changed by the changing device, to turn on or off to allow or block flowing of the constant current whose value has not been changed, a second switching device that is operable when a value of the constant current caused to flow by the second constant-current device has been changed by the changing device, to turn on or off to allow or block flowing of the constant current whose value has been changed, and operable when the value of the constant current caused to flow by the second constant-current device has not been changed by the changing device, to turn on or off to allow or block flowing of the constant current whose value has not been changed, a first comparison device that compares the output voltage from the amplifier and the first predetermined voltage for outputting a signal of a logic level dependent on a result of the comparison, a second comparison device that compares the output voltage from the amplifier and the second predetermined voltage for outputting a signal of a logic level dependent on a result of the comparison, and a flip-flop that inverts a logic level of an output signal therefrom when it is detected by the first comparison device that the output voltage from the amplifier has increased to reach the first predetermined voltage, or when it is detected by the second comparison device that the output voltage from the amplifier has decreased to reach the second predetermined voltage, whereby the first and second switching devices turn on or off, depending the logic level of the output signal from the flip-flop.

With the arrangement of the pulse width modulation amplifier according to the second aspect of the present invention, a changing device is provided which changes the constant currents that determine pulse slopes of a triangular wave used for the pulse width modulation of an input signal, and the changing device is realized by a simple construction. Therefore, it is possible to reduce unwanted radiation from the PWM output, which can cause EMI, while reducing manufacturing costs thereof.

Preferably, the pulse width modulation amplifier further comprises a clock pulse input terminal that receives a clock pulse externally supplied, and the constant-current value-setting device comprises a phase comparison device that compares a phase of the clock pulse inputted via the clock pulse input terminal and a phase of the output signal from the flip-flop, a current-generating device that generates a current such that a direction of flow thereof and a current value thereof depend on a result of the comparison by the phase comparison device, a low-pass filter that integrates the current generated by the current-generating device, and a control device that controls the constant currents that flow from the first and second constant-current devices, according to an output from the low-pass filter.

More preferably, the changing device comprises a third constant-current device disposed for connection in parallel with the first constant-current device, a fourth constant-current device disposed for connection in parallel with the second constant-current device, eighth and ninth switching devices that control whether or not the third and fourth constant-current devices are to be connected to the first and second constant-current devices, respectively, and a D-type flip-flop that inverts a logic level of an output signal therefrom in synchronism with a rise of the output signal from the flip-flop, whereby the seventh switching device turns on or off, depending on the logic level of the output signal from the D-type flip-flop.

The above and other objects, features, and advantages of the present invention will become more apparent from the following detailed description taken in conjunction with the accompanying drawings.

BRIEF DESCRIPTION OF THE DRAWINGS

FIGS. 6A to 6F are timing charts showing changes in signals generated in the triangular wave-generating circuit shown in FIG. 5, in which:

FIG. 6A shows changes in output voltage from an operational amplifier;

FIG. 6B shows changes in an output signal from a comparator;

FIG. 6C shows changes in an output signal from a NAND gate;

FIG. 6D shows changes in an output signal from another comparator;

FIG. 6E shows changes in a reference clock pulse;

FIG. 6F shows changes in an analog signal corresponding to an output from a phase comparator;

DETAILED DESCRIPTION OF THE PREFERRED EMBODIMENTS

The present invention will now be described in detail with reference to the drawings showing preferred embodiments thereof.

Figure 1:
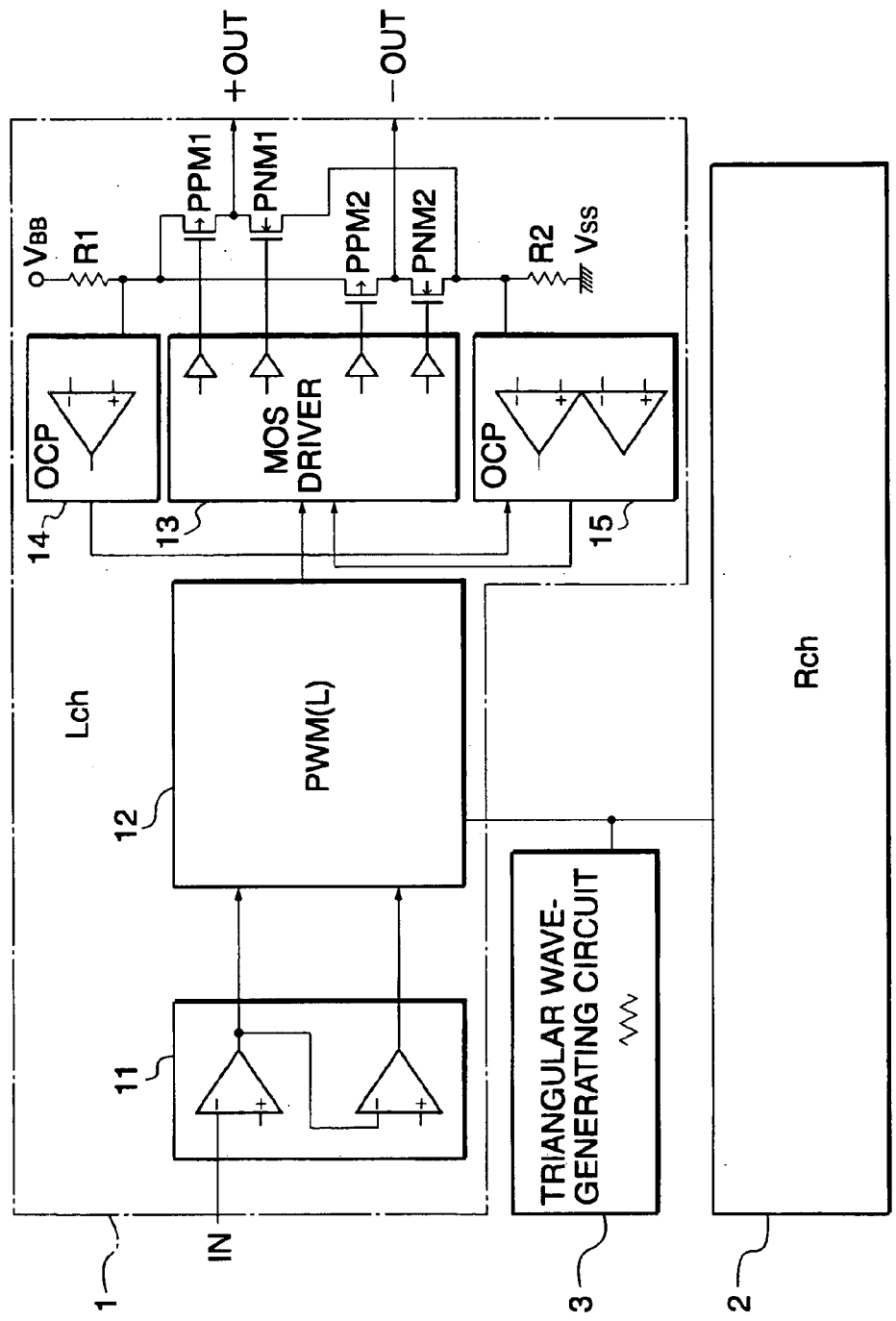
FIG. 1 is a block diagram showing the whole arrangement of a PWM amplifier according to a first embodiment of the present invention.

FIG. 1 is a block diagram showing the whole arrangement of a PWM (pulse width modulation) amplifier according to a first embodiment of the present invention.

As shown in FIG. 1, the PWM amplifier according to the present embodiment is mainly comprised of a left-channel (Lch) PWM amplification section 1 including a BTL (Balanced Transformer Less) output circuit operating on a single power source VBB, a right-channel (Rch) PWM amplification section 2 including a BTL output circuit similarly operating on a single power source, and a triangular wave-generating circuit 3 that generates a triangular wave within a predetermined frequency range and applies the generated triangular wave to the PWM amplification sections 1 and 2.

The Lch PWM amplification section 1 is comprised of an input signal-amplifying section 11 that amplifies an input signal IN which is an audio signal, a PWM section 12 that compares the level of the amplified input signal IN and that of the triangular wave applied from the triangular wave-generating circuit 3 to thereby generate a pulse signal having a duty ratio corresponding to the level of the input signal IN, field-effect transistors PNM1, PPM1, PNM2 and PPM2, a MOS (Metal Oxide Semiconductor) driver 13 that drives the field-effect transistors PNM1, PPM1, PNM2 and PPM2, a first overcurrent protection (OCP) circuit 14 that detects the value of a voltage applied to a resistance R1, to thereby detect overcurrent flowing through the field-effect transistors PNM1 and PPM1 or PNM2 and PPM2, which can be caused e.g. by a short-circuit between output terminals +OUT and −OUT of the Lch PWM amplification section 1, a second overcurrent protection (OCP) circuit 15 that detects the value of a voltage applied to a resistance R2 to thereby detect the above overcurrent flowing through the field-effect transistors PNM1 and PPM1 or PNM2 and PPM2, and detects that dc current flows through a loudspeaker connected to the output terminals +OUT and −OUT, via first and second low-pass filters, referred to hereinafter, when one signal input terminal of the loudspeaker is grounded with the other signal input terminal of the same connected to one of the output terminals +OUT and −OUT, by detecting a negative voltage applied to the resistance R2.

The driver 13 and the field-effect transistors PNM1, PPM1, PNM2, and PPM2 constitute the BTL output circuit which operates on the single power source VBB.

The driver 13 is supplied with a PWM output from the PWM section 12, generates an inverted pulse signal obtained by inverting the PWM output, and outputs the PWM output and the inverted pulse signal.

A first complementary circuit is formed by the P-channel field-effect transistor PPM1 and the N-channel field-effect transistor PNM1 and driven by the PWM output delivered from the driver 13. A second complementary circuit is formed by the P-channel field-effect transistor PPM2 and the N-channel field-effect transistor PNM2 and driven by the inverted pulse signal delivered from the driver 13.

Respective outputs from the first and second complementary circuits are supplied respectively to the first low-pass filter, not shown, comprised of a coil and a capacitor, and the second low-pass filter, not shown, comprised of a coil and a capacitor, wherein high-frequency components of the outputs from the first and second complementary circuits are removed by the respective first and second low-pass filters, and the loudspeaker is driven by outputs from the first and second low-pass filters.

It should be noted that the first and second overcurrent protection circuits 14 and 15 are not essential to the present invention, and hence description thereof is omitted.

Further, the Rch PWM amplification section 2 has an identical construction to that of the Lch PWM amplification section 1, and the detailed circuit configuration thereof is not shown.

Figure 2:
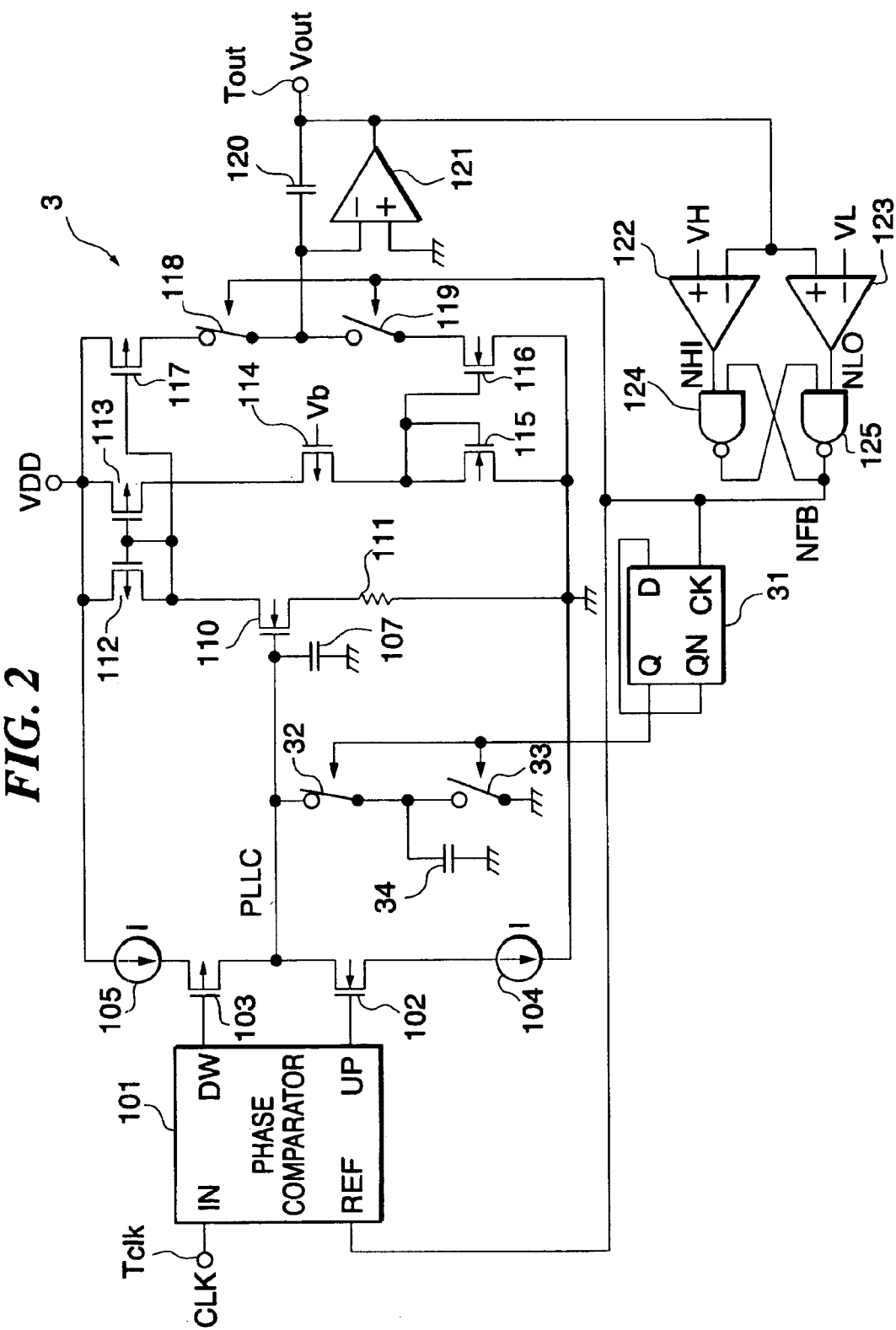
FIG. 2 is a diagram showing the detailed circuit configuration of a triangular wave-generating circuit appearing in FIG. 1.

FIG. 2 shows the detailed circuit configuration of the triangular wave-generating circuit 3. The triangular wave-generating circuit 3 shown in FIG. 2 has a construction based on a triangular wave-generating circuit 100 shown in FIG. 5, which is described in Japanese Patent Application No. 2002-181772, filed by the present assignee. Therefore, the outline of operation of the triangular wave-generating circuit 100 will be described first with reference to FIG. 5 and FIGS. 6A to 6F, and then the configuration and operation of the triangular wave-generating circuit 3 will be described with reference FIG. 2.

Figure 5:
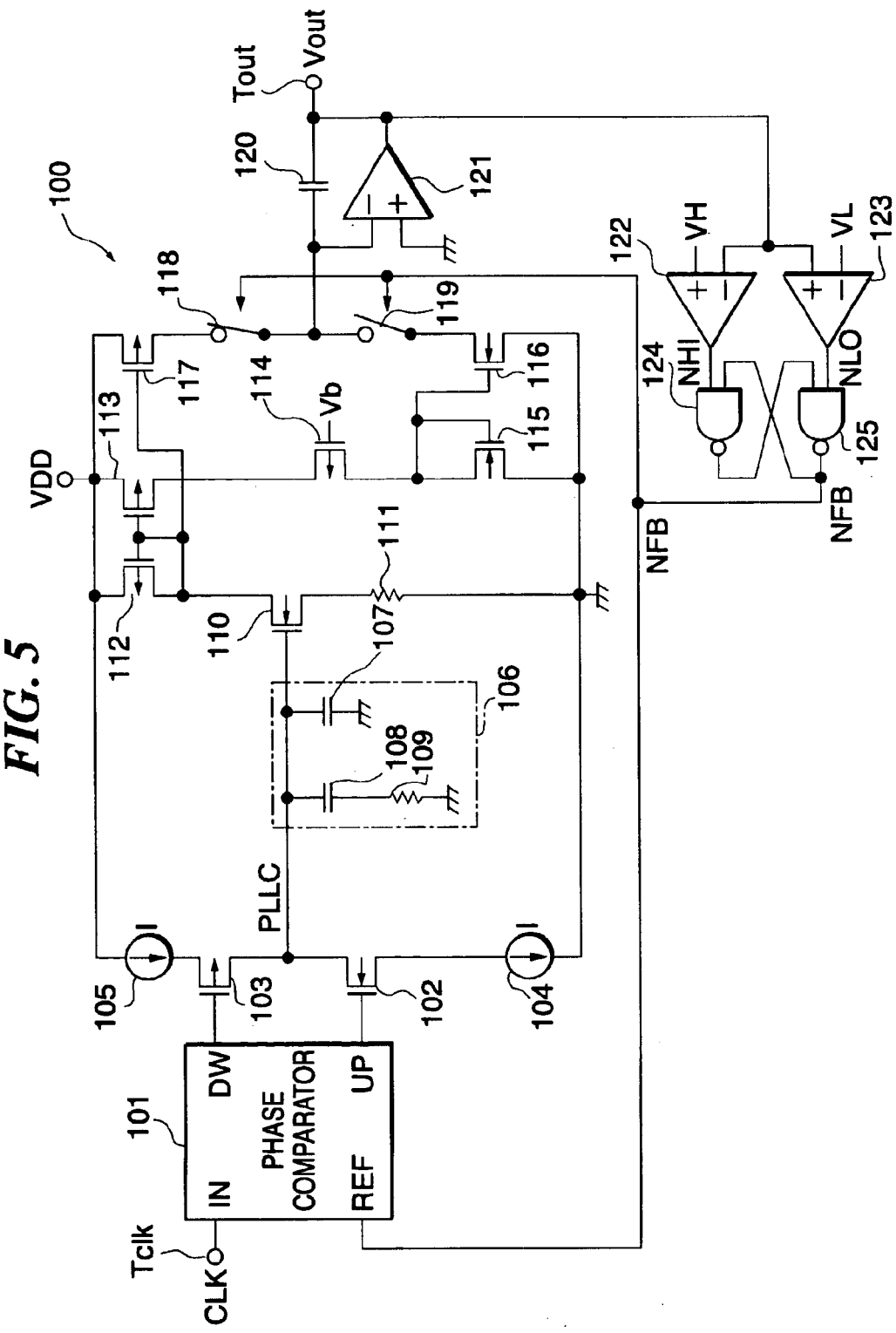
FIG. 5 is a diagram showing the circuit configuration of the triangular wave-generating circuit used as a basis of the triangular wave-generating circuit shown in FIG. 2.

Referring to FIG. 5, when the power is turned on to drive the triangular wave-generating circuit 100, either of switching elements 118 and 119 is turned on depending on the high/low level of an output signal NFB from a NAND gate 125. Now, assuming that the signal NFB is low and the switching element 118 is turned on, a capacitor 120 is progressively charged by a current (constant current) flowing through a P-channel FET (field-effect transistor) 117 in a charging direction, causing output voltage from an operational amplifier 121 to linearly decrease, as indicated by a slope P1 in FIG. 6A. When the output voltage from the operational amplifier 121 has reached a value VL (time point t1), an output signal NLO from a comparator 123 goes low (FIG. 6B), whereby the output signal NFB from the NAND gate 125 goes high (FIG. 6C).

When the output signal NFB goes high, the switching elements 118 and 119 are turned off and on, respectively, and hence the capacitor 120 is discharged by a current (constant current) flowing through an N-channel FET 116 in a direction opposite to the above charging direction, so that the output voltage from the operational amplifier 121 starts to increase. When the output voltage from the operational amplifier 121 increases above a predetermined threshold value, the output signal NLO from the comparator 123 returns to the high level (FIG. 6B). However, at this time, an output signal from a NAND gate 124 has gone low, so that the signal NFB continues to be high, whereby the output voltage from the operational amplifier 121 linearly increases, as indicated by a slope P2 in FIG. 6A.

Figure 6:
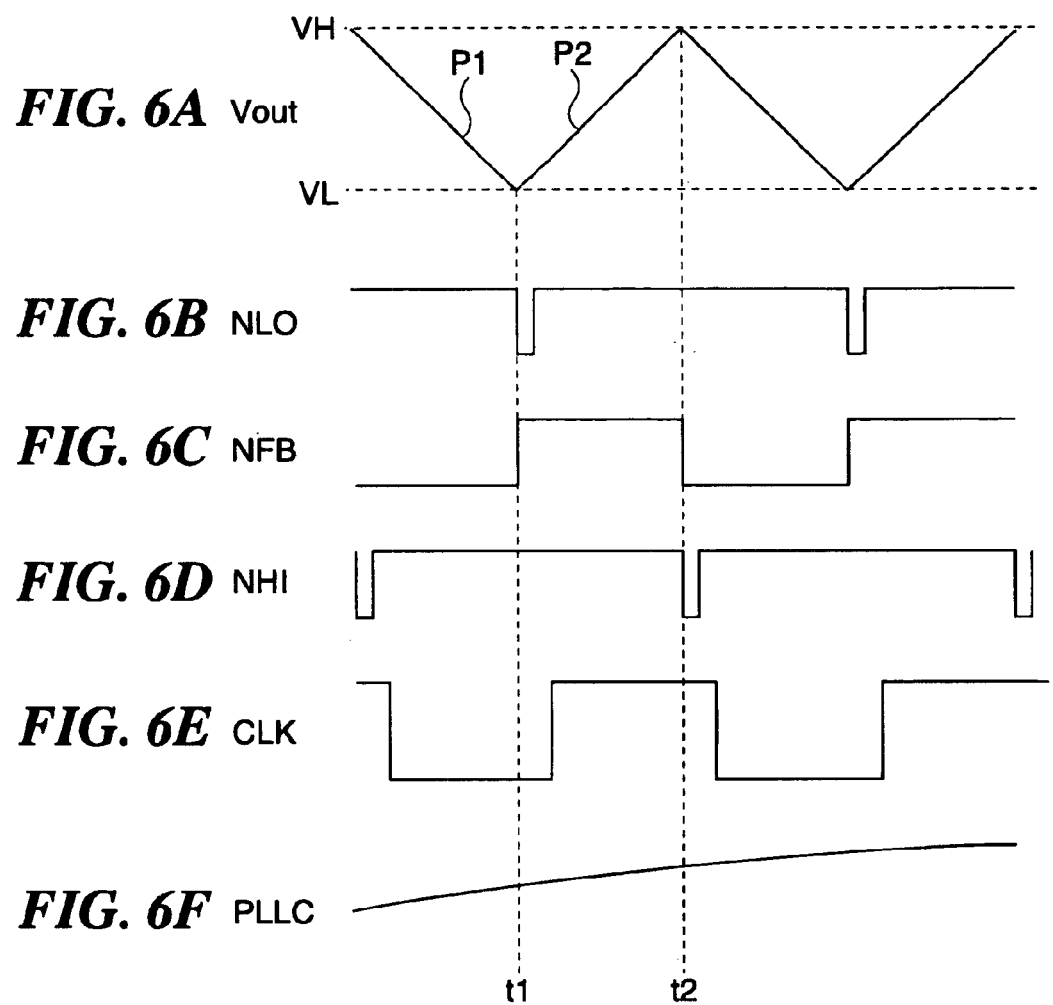

When the output voltage from the operational amplifier 121 has reached a value VH at a time point t2, an output signal NHI from a comparator 122 goes low (FIG. 6D), whereby the output signal from the NAND gate 124 is inverted to the high level, causing the output signal NFB from the NAND gate 125 to go low (FIG. 6C). When the output signal NFB goes low, the switching elements 118 and 119 are turned on and off, respectively, so that the output voltage from the operational amplifier 121 starts to decrease. When the output voltage from the operational amplifier 121 starts to decrease, the output signal NHI from the comparator 122 goes high again.

Thereafter, the above-described operations are repeatedly carried out, whereby an output voltage Vout having a triangular waveform is obtained from an output terminal Tout. As will be clearly understood from the above description, the speeds of rise and fall of each pulse of the triangular wave depend on the respective values of currents flowing through the FETs 116 and 117. If the current values are large, the triangular wave has a waveform steep in pulse rising and falling slopes, whereas if the current values are small, the triangular wave has a waveform gentle in pulse rising and falling slopes.

Next, a description will be given of a circuit for determining the values of currents flowing through the FETs 116 and 117.

Now, when a reference clock pulse CLK (FIG. 6E) is inputted to a terminal Tclk, a phase comparator 101 compares the phase of the signal NFB and that of the clock pulse CLK, and delivers a high-level signal from an output terminal UP or DW to an FET 102 or 103, depending on the result of the comparison. When the FET 103 is turned on by the high-level signal from the output terminal DW, a constant current I from a constant-current source 105 connected to the drain of the FET 103 flows into a low-pass filter (integrating circuit) 106 comprised of capacitors 107 and 108, and a resistance 109. On the other hand, when the FET 102 is turned on by the high-level signal from the output terminal UP, the constant current I flows from the low-pass filter 106 to a constant-current source 104 connected to the source of the FET 102. This causes an analog signal PLLC (FIG. 6F) corresponding to the output from the phase comparator 101 to be applied to the gate of an FET 110.

The FET 110 controls a current flowing through a FET 112, based on the level (electric potential) of the analog signal PLLC. More specifically, when the level of the analog signal PLLC increases, the source-gate bias of the FET 110 increases to decrease the current flowing through the FET 112, whereas when the level of the analog signal PLLC decreases, the source-gate bias of the FET 110 decreases to increase the current flowing through the FET 112.

A series circuit formed by the FETs 112 and 110 and a resistance 111 and a series circuit formed by FETs 113 to 115 form a current mirror circuit, and the series circuit formed by the FETs 112 and 110 and the resistance 111 and the FET 117 form a current mirror circuit. Further, the series circuit formed by FETs 113 to 115 and the FET 116 form a current mirror circuit. As a result, the value of the current flowing through the FET 112 and that of the current flowing through the FET 116 or 117 are at a FET size ratio. In other words, a change in the value of the current flowing through the FET 112 causes a corresponding change in the value of the current flowing through the FET 116 or 117, whereby the rising and falling slopes of the output voltage from the operational amplifier 121 change to change the repetition period of the signal NFB.

As described above, the phase of the signal NFB is changed by the PLL (phase locked loop) operation such that it coincides with the phase of the clock pulse CLK, and hence the repetition period of the signal NFB coincides with that of the clock pulse CLK. That is, the repetition period of the triangular wave outputted from the output terminal Tout becomes equal to that of the reference clock pulse CLK.

Next, a description will be given of the triangular wave-generating circuit 3 shown in FIG. 2.

The triangular wave-generating circuit 3 is different from the triangular wave-generating circuit 100 described above in that a D-type flip-flop 31, switching elements 32 and 33, and a capacitor 34 are additionally provided, and therefore in FIG. 2, component elements corresponding to those shown in FIG. 5 are designated by identical reference numerals, and detailed description thereof is omitted.

Referring to FIG. 2, the D-type flip-flop 31 has an input terminal CK for receiving the signal NFB, an input terminal D for receiving an output signal from an inverted output terminal QN thereof, and an output terminal Q connected to the switching elements 32 and 33.

The switching elements 32 and 33 are configured, for example, such that they turn on and off, respectively, when an output from the output terminal Q is high, and turn off and on, respectively, when the output from the output terminal Q is low. The switching element 32 has a function of selectively establishing parallel connection of the capacitor 34 with the capacitor 107, depending on whether the switching element 32 is on or off, to thereby change the capacitance of a capacitor connected to the gate of the FET 110. More specifically, when the switching element 32 is on, the total capacitance of the capacitors 107 and 34 connected to the gate of the FET 110 is larger than the capacitance of the capacitor 107 connected thereto when the switching element 32 is off. Therefore, even with the supply of the signal PLLC having the same current value as a current value supplied when the switching element 32 is off, the voltage applied to the gate of the FET 110 changes (becomes higher or lower), whereby the triangular wave has its pulse slopes changed, as described hereinafter. On the other hand, the switching element 33 has a function of causing an electric charge accumulated in the capacitor 34 to be discharged to ground when it is on. That is, unless the switching element 33 is provided, the switching element 32 repeatedly turns on and off a predetermined number of times, and if the FET 102 does not turn on after the capacitor 34 is fully charged by the constant current I supplied from the constant-current source 105, the fully-charged state of the capacitor 34 continues to thereby-inhibit the voltage applied to the gate of the FET 110 from being changed. To eliminate this inconvenience, the switching element 33 is provided. This enables the pulse slopes of the triangular wave to be changed even in such a case.

Next, a description will be given of the operation of the triangular wave-generating circuit 3 configured as above.

When the triangular wave-generating circuit 3 is supplied with power from the power source and the signal NFB rises from low to high, if a low-level signal has been inputted to the input terminal D of the D-type flip-flop 31, a low-level signal is outputted from the output terminal Q of the D-type flip-flop 31. This causes the switching elements 32 and 33 to turn off and on, respectively, to generate a triangular wave having the same waveform as that of the triangular wave generated by the triangular wave-generating circuit 100 described above.

Figure 3:
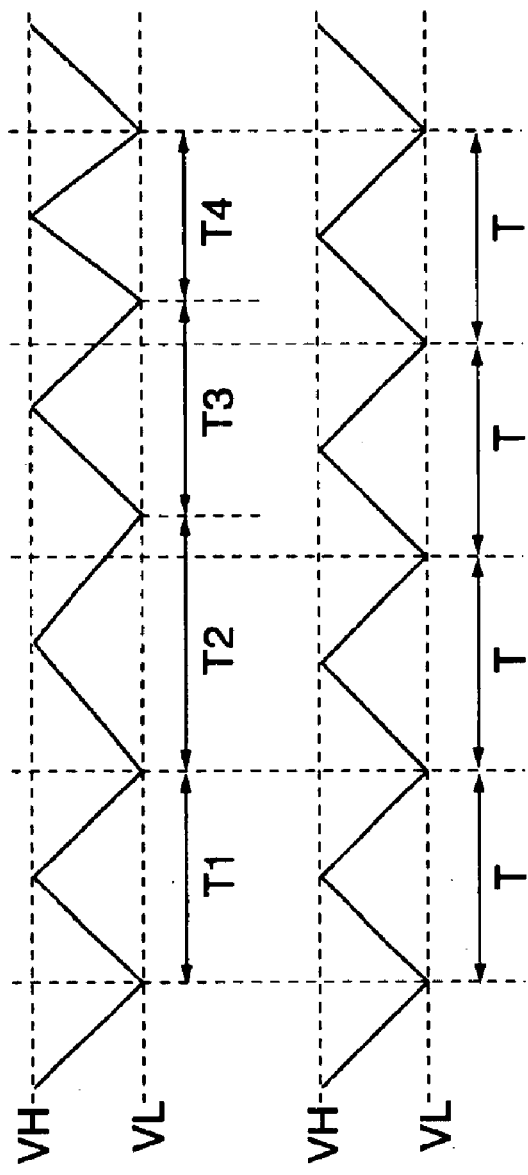
FIGS. 3A and 3B are diagrams showing examples of triangular waves generated by the triangular wave-generating circuit shown in FIG. 2 and a triangular wave-generating circuit shown in FIG. 5, respectively.

FIGS. 3A and 3B show examples of triangular waves generated by the triangular wave-generating circuits 3 and 100, respectively, in which FIG. 3A shows the triangular wave generated by the triangular wave-generating circuit 3, while FIG. 3B shows the triangular wave generated by the triangular wave-generating circuit 100.

More specifically, in FIG. 3A, a pulse of the triangular wave with a time duration T1 is generated due to the above operation of the triangular wave-generating circuit 3.

Then, when the signal NFB rises again from low to high, since a high-level signal has been inputted to the input terminal D of the D-type flip-flop 31 at this time, a high-level signal is outputted from the output terminal Q, whereby the switching elements 32 and 33 are turned on and off, respectively, thereby causing the capacitor 34 to be connected in parallel with the capacitor 107, as described above. When the capacitor 34 is connected in parallel with the capacitor 107, the total capacitance of the capacitors 107 and 34 connected to the FET gate 110 increases, so that even with the supply of the signal PLLC having the same current value as supplied when the switching element 32 is off, the voltage applied to the gate of the FET 112 changes. Namely, the slopes of a pulse of the triangular wave generated at this time are changed in comparison with those of the immediately preceding pulse of the triangular wave. Therefore, a pulse e.g. with a time duration T2 in FIG. 3A is generated.

Further, when the signal NFB rises again from low to high, since a low-level signal has been inputted to the input terminal D of the D-type flip-flop 31 at this time, a low-level signal is outputted from the output terminal Q, whereby the switching elements 32 and 33 are turned off and on, respectively, causing cancellation of the parallel connection of the capacitor 34 and the capacitor 107. This causes an electric charge accumulated in the capacitor 34 to be discharged to ground. In short, in FIG. 3A, a pulse having the same shape as the pulse of the triangular wave with the time duration T1 is generated (with a time duration T3). However, in actuality, the shape of the pulse of triangular wave with the time duration T3 does not completely agree with the shape of the pulse of the triangular wave with the time duration T1, since the waveform of the triangular wave is determined depending on the current value of the signal PLLC, as described above, and the current value of the signal PLLC changes according to the value of the output from the phase comparator 101, in other words, the result of comparison between the phase of the signal NFB and that of the clock pulse CLK (phase shift therebetween).

The above operations are repeated, whereby a triangular wave formed by pulses different in slope, that is, a triangular wave formed by pulses having different periods is generated, and outputted from the output terminal Tout.

An input signal is subjected to PWM amplification based on the triangular wave generated as above, and the resulting output signal has reduced unwanted radiation therefrom, which can cause EMI (electromagnetic interference), according to the same principle as that of the conventional PWM amplifier. The triangular wave-generating circuit 3 is thus configured to generate a triangular wave formed by pulses having different slopes, simply by adding only the D-type flip-flop 31, the switching elements 32 and 33, and the capacitor 34, to the configuration of the triangular wave-generating circuit 100 that generates a conventional triangular wave. This makes it possible to reduce manufacturing costs of the PWM amplifier in comparison with the conventional PWM amplifier.

Next, a description will be given of a PWM amplifier according to a second embodiment of the present invention.

The PWM amplifier according to the present embodiment is distinguished from the PWM amplifier according to the first embodiment only in the configuration of the triangular wave-generating circuit, and therefore, the following description refers only to the triangular wave-generating circuit.

Figure 4:
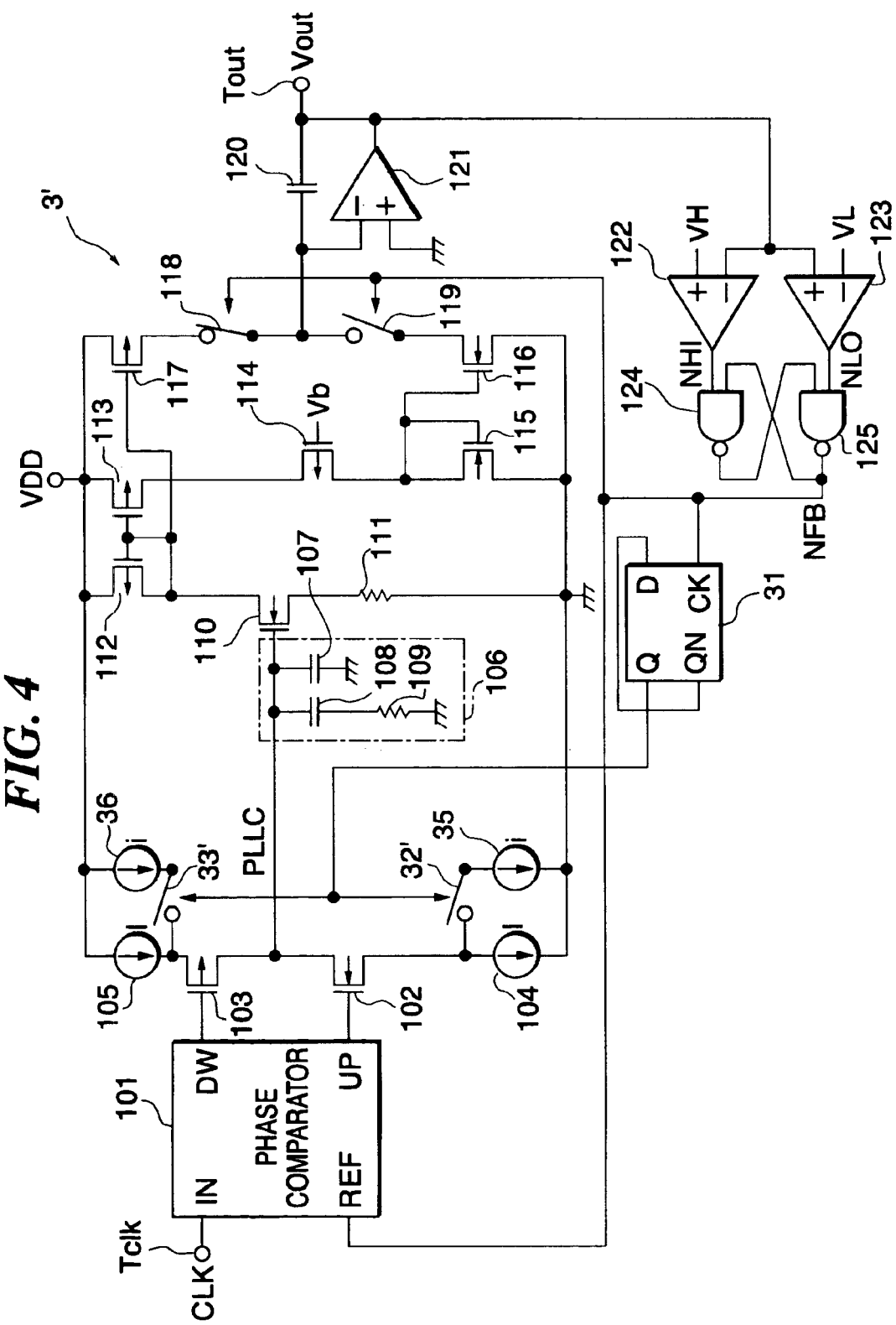
FIG. 4 is a diagram showing the detailed circuit configuration of a triangular wave-generating circuit incorporated in a PWM amplifier according to a second aspect of the present invention.

FIG. 4 shows the detailed circuit configuration of the triangular wave-generating circuit 3' incorporated in the PWM amplifier according to the present embodiment. In FIG. 4, component elements corresponding to those shown in FIG. 2 are designated by identical reference numerals, and detailed description thereof is omitted.

In FIG. 4, switching elements 32' and 33' have functions of selectively establishing parallel connection of a constant-current source 35 with the constant-current source 104, and parallel connection of a constant-current source 36 with the constant-current source 105, respectively. It should be noted that the switching elements 32' and 33' are configured, differently from the switching elements 32 and 33 appearing in FIG. 2, such that they are both turned on when the output from the output terminal Q of the D-type flip-flop 31 is high, and both turned off when the output from the same is low.

Next, a description will be given of the operation of the triangular wave-generating circuit 3' configured as above.

When the triangular wave-generating circuit 3' is supplied with power from the power source and the signal NFB rises from low to high, if a low-level signal has been inputted to the input terminal D of the D-type flip-flop 31, a low-level signal is outputted from the output terminal Q. This causes the switching elements 32' and 33' to turn off so that only the constant-current sources 104 and 105 are enabled but the constant-current sources 35 and 36 are disconnected from the circuit 3'. As a consequence, the signal PLLC is formed by a constant current I supplied from one of the constant-current sources 104 and 105, depending on the output from the phase comparator 101.

Then, when the signal NFB rises again from low to high, since a high-level signal has been inputted to the input terminal D of the D-type flip-flop 31 at this time, a high-level signal is outputted from the output terminal Q. This causes the switching elements 32' and 33' to turn on so that not only the constant-current sources 104 and 105 but also the constant-current sources 35 and 36 are enabled. As a consequence, the signal PLLC is formed by a constant current I+i supplied from one of a combination of the constant-current sources 104 and 35, and a combination of the constant-current sources 105 and 36, depending on the output from the phase comparator 101.

PLL control current is thus changed between the constant current I and the constant current I+i, whereby the voltage of the signal PLLC changes to change the slopes of pulses of the triangular wave.

The above operations are repeated, whereby a triangular wave formed by pulses different in slope, that is, a triangular wave formed by pulses having different periods is generated, and outputted from the output terminal Tout.

An input signal is subjected to PWM amplification based on the triangular wave generated as above, and the resulting output signal has reduced unwanted radiation therefrom, which can cause EMI, according to the same principle as that of the conventional PWM amplifier. The triangular wave-generating circuit 3' is thus configured to generate a triangular wave formed by pulses having different slopes, simply by adding only the D-type flip-flop 31, the switching elements 32' and 33', and the constant-current sources 35 and 36, to the configuration of the triangular wave-generating circuit 100 that generates a conventional triangular wave. This makes it possible to reduce manufacturing costs of the PWM amplifier in comparison with the conventional PWM amplifier.

Next, a description will be given of a PWM amplifier according to a third embodiment of the present invention.

The PWM amplifier according to the present embodiment is also distinguished from the PWM amplifier according to the first embodiment only in the configuration of the triangular wave-generating circuit, and therefore, the following description will refers only to the triangular wave-generating circuit.

Figure 7:
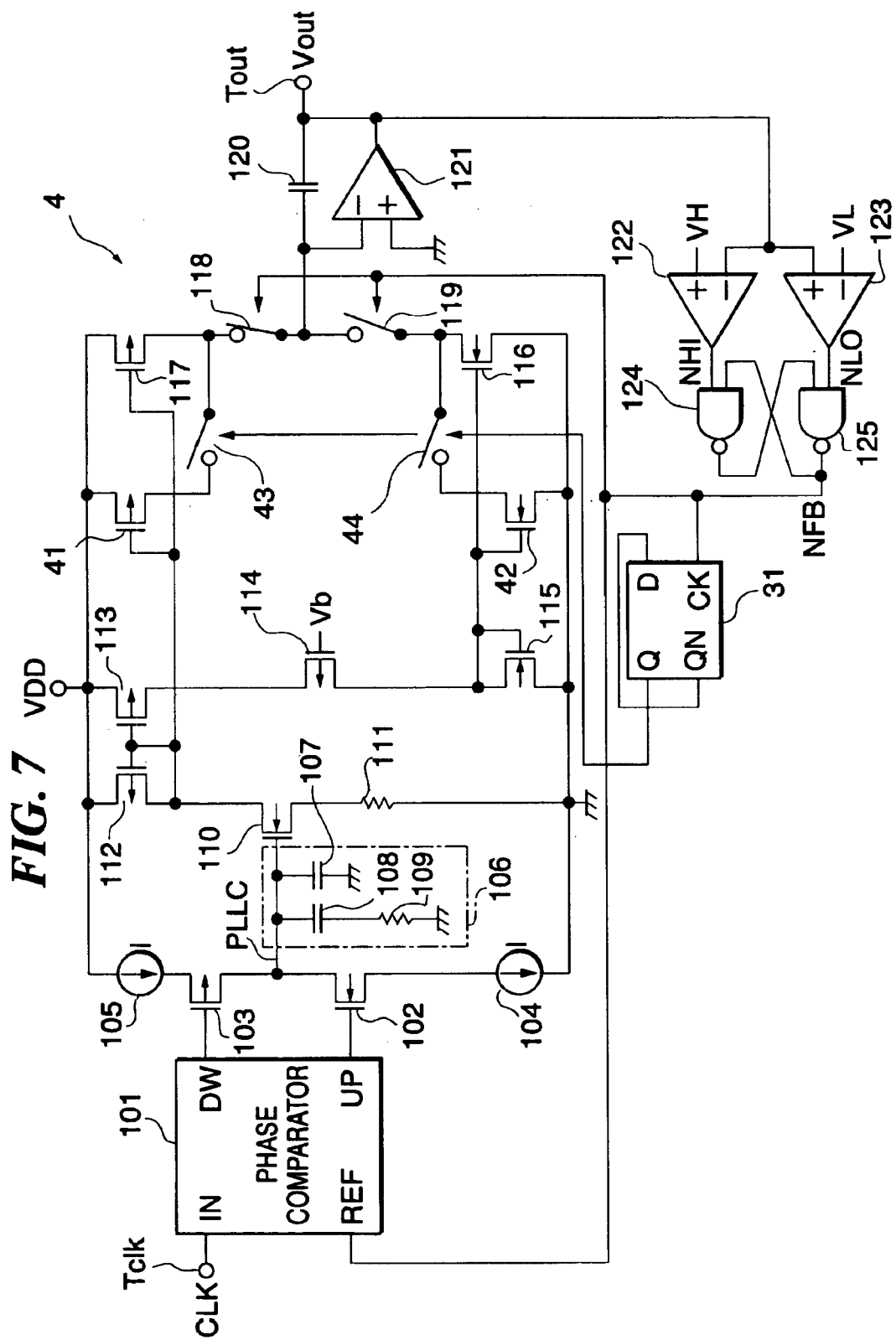
FIG. 7 is a diagram showing the detailed circuit configuration of a triangular wave-generating circuit incorporated in a PWM amplifier according to a third aspect of the present invention.

FIG. 7 shows the detailed circuit configuration of the triangular wave-generating circuit 4 incorporated in the PWM amplifier according to the present embodiment. In FIG. 7, component elements corresponding to those shown in FIG. 2 are designated by identical reference numerals, and detailed description thereof is omitted.

In FIG. 7, a switching element 43 has a function of selectively establishing parallel connection of an FET 41 as a constant-current source with the FET 117 as a constant-current source, and a switching element 44 has a function of selectively establishing parallel connection of an FET 42 as a constant-current source with the FET 116 as a constant-current source. The switching elements 43 and 44 are configured, differently from the switching elements 32 and 33 in FIG. 2, such that they are both turned on when the output from the output terminal Q of the D flip-flop 31 is high, and both turned off when the output from the output terminal Q is low.

The FET 41 and the series circuit formed by the FETs 112 and 110 and the resistance 111 form a current mirror circuit, and the FET 42 and the series circuit formed by the FETs 113 to 115 form a current mirror circuit. Further, as described hereinabove with reference to FIG. 5, the series circuit formed by the FETs 112 and 110 and the resistance 111 and the series circuit formed by the FETs 113 to 115 form a current mirror circuit, and the series circuit formed by the FETs 112 and 110 and the resistance 111 and the FET 117 form a current mirror circuit. Further, the series circuit formed by the FETs 113 to 115 and the FET 116 form a current mirror circuit. As a result, the respective values of the currents flowing through the FETs 41 and 42, and the FETs 116 and 117 are at an FET size ratio. More specifically, when the switching element 43 is turned on, and at the same time the switching element 118 is turned on, the sum of respective currents flowing through the FET 117 and the FET 41 flows into the capacitor 120, whereas when the switching element 44 is turned on and at the same time the switching element 119 is turned on, the sum of respective currents flowing through the FET 116 and the FET 42 flows out from the capacitor 120.

Next, a description will be given of the operation of the triangular wave-generating circuit 4 configured as above.

When the triangular wave-generating circuit 4 is supplied with power from the power source and the signal NFB rises from low to high, if a low-level signal has been inputted to the input terminal D of the D-type flip-flop 31, a low-level signal is outputted from the output terminal Q. This causes the switching elements 43 and 44 to turn off so that only the constant-current sources 117 and 116 are enabled but the constant-current sources 41 and 42 are disconnected from the circuit 4. As a consequence, the current flowing into the capacitor 120 is formed only by the current flowing out from the constant-current source 117, and the current flowing out from the capacitor 120 is formed only by the current flowing into the constant-current source 116, so that a triangular wave is generated which has the same shape as that of the triangular wave generated by the triangular wave generating circuit 100 shown in FIG. 5. That is, a pulse of the triangular wave with the time duration T1 in FIG. 3A is generated due to the above operation of the triangular wave generating circuit 4.

Then, when the signal NFB rises again from low to high, since a high-level signal has been inputted to the input terminal D of the D-type flip-flop 31 at this time, a high-level signal is outputted from the output terminal Q. This causes the switching elements 43 and 44 to turn on so that not only the constant-current sources 117 and 116 but also the constant-current sources 41 and 42 are enabled. As a consequence, the current flowing into the capacitor 120 is formed by the sum of the current flowing out from the constant-current source 117 and a current flowing out from the constant-current source 41, and the current flowing out from the capacitor 120 is formed by the sum of the current flowing into the constant-current source 116 and a current flowing into the constant-current source 42, so that the slopes of a pulse of the triangular wave generated at this time are changed in comparison with those of the immediately preceding pulse of the triangular wave having been generated, i.e. the slopes of the pulse of the triangular wave generated when the switching elements 43 and 44 are off.

The above operations are repeated, whereby a triangular wave formed by pulses different in slope, that is, a triangular wave formed by pulses having different periods is generated, and outputted from the output terminal Tout.

An input signal is subjected to PWM amplification based on the triangular wave generated as above, and the resulting output signal has reduced unwanted radiation therefrom, which can cause EMI, according to the same principle as that of the conventional PWM amplifier. The triangular wave-generating circuit 4 is thus configured to generate a triangular wave formed by pulses having different slopes, simply by adding only the D-type flip-flop 31, the FETs 41 and 42, and the switching elements 43 and 44, to the configuration of the triangular wave-generating circuit 100 that generates a conventional triangular wave. This makes it possible to reduce manufacturing costs of the PWM amplifier in comparison with the conventional PWM amplifier.

Next, a description will be given of a PWM amplifier according to a fourth embodiment of the present invention.

The PWM amplifier according to the present embodiment is also distinguished from the PWM amplifier according to the first embodiment only in the configuration of the triangular wave-generating circuit, and therefore, the following description refers only to the triangular wave-generating circuit.

Figure 8:
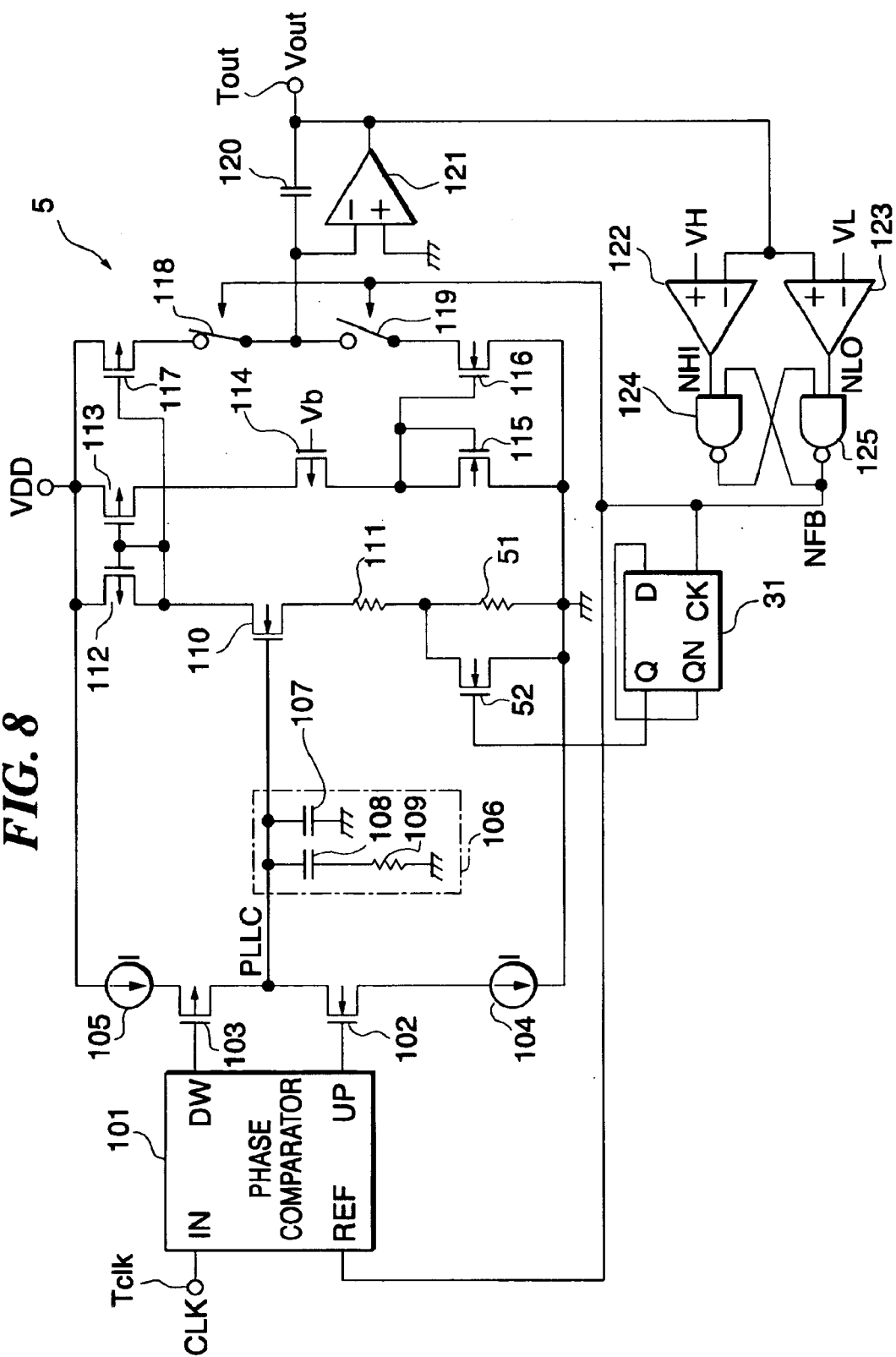
FIG. 8 is a diagram showing the detailed circuit configuration of a triangular wave-generating circuit incorporated in a PWM amplifier according to a fourth aspect of the present invention.

FIG. 8 shows the detailed circuit configuration of the triangular wave-generating circuit 5 incorporated in the PWM amplifier according to the present embodiment. In FIG. 8, component elements corresponding to those shown in FIG. 2 are designated by identical reference numerals, and detailed description thereof is omitted.

In FIG. 8, an FET 52 has a function of selectively establishing series connection of a resistance 51 with the resistance 111 or substantially canceling the series connection. More specifically, when an output from the output terminal Q of the D flip-flop 31 is high, the FET 52 is turned off to thereby maintain series connection of the resistance 51 and the resistance 111, and when the output from the output terminal Q is low, the FET 52 is turned on to short-circuit the resistance 51 to thereby substantially disconnect the resistance 51 from the resistance 111.

Next, a description will be given of the operation of the triangular wave-generating circuit 5 configured as above.

When the triangular wave-generating circuit 5 is supplied with power from the power source and the signal NFB rises from low to high, if a low-level signal has been inputted to the input terminal D of the D-type flip-flop 31, a low-level signal is outputted from the output terminal Q. This causes the FET 52 to turn on so that the resistance 51 is substantially disconnected from the resistance 111. At this time, the configuration of the triangular wave-generating circuit 5 is the same as that of the triangular wave-generating circuit 100 shown in FIG. 5, and therefore, the triangular wave-generating circuit generates a triangular wave having the same shape as that of the triangular wave generated by the triangular wave generating circuit 100 shown in FIG. 5. That is, a pulse of the triangular wave with the time duration T1 in FIG. 3A is generated by the above operation of the triangular wave generating circuit 5.

Then, when the signal NFB rises again from low to high, since a high-level signal has been inputted to the input terminal D of the D-type flip-flop 31 at this time, a high-level signal is outputted from the output terminal Q. This causes the FET 52 to turn off so that the resistance 51 is connected in series with the resistance 111, causing the potential of the source of the FET 110 to become higher than when the resistance 51 is disconnected (short-circuited). Therefore, even when the same voltage is applied to the gate of the FET 110, the source-gate bias of the FET 110 varies depending whether or not the resistance 51 is substantially disconnected. That is, the slopes of a pulse of the triangular wave generated at this time are changed in comparison with those of the immediately preceding pulse of the triangular wave having been generated, i.e. the slopes of the pulse of the triangular wave generated when the FET 52 is on.

The above operations are repeated, whereby a triangular wave formed by pulses different in slope, that is, a triangular wave formed by pulses having different periods is generated, and outputted from the output terminal Tout.

An input signal is subjected to PWM amplification based on the triangular wave generated as above, and the resulting output signal has reduced unwanted radiation therefrom, which can cause EMI, according to the same principle as that of the conventional PWM amplifier. The triangular wave-generating circuit 5 is thus configured to generate a triangular wave formed by pulses having different slopes, simply by adding only the D-type flip-flop 31, the resistance 51, and the FET 52, to the configuration of the triangular wave-generating circuit 100 that generates a conventional triangular wave. This makes it possible to reduce manufacturing costs of the PWM amplifier in comparison with the conventional PWM amplifier. Further, the triangular wave-generating circuit 5 has a smaller number of components to be additionally provided, compared with the triangular wave-generating circuits 3, 3' and 4, which makes it possible to further simplify the circuit configuration of the triangular wave-generating circuit.

What is claimed is:

1. A pulse width modulation amplifier comprising:

an input terminal that receives a signal;

a triangular wave-generating device that generates a triangular wave;

a pulse width modulation amplification device that performs pulse width modulation amplification of the signal input via said input terminal based on the triangular wave generated by said triangular wave-generating device; and an output terminal that outputs the signal subjected to the pulse width modulation amplification by said pulse width modulation amplification device, wherein said triangular wave-generating device comprises an integrating device that includes an amplifier having a signal input terminal and a signal output terminal, and a capacitance element connected between said signal input terminal and said signal output terminal of said amplifier, a first constant-current device that charges said capacitance element such that an output voltage from said amplifier becomes equal to a first predetermined voltage, by causing a constant current to flow through said capacitance element in a predetermined direction, a second constant-current device that discharges said capacitance element such that the output voltage from said amplifier becomes equal to a second predetermined voltage lower than the first predetermined voltage, by causing a constant current to flow through said capacitance element in a direction opposite to the predetermined direction, a constant-current value-setting device that sets values of the constant currents caused to flow by said first and second constant-current devices, a changing device that changes the values of the constant currents set by said constant-current value-setting device, a first switching device that turns on or off to allow or block flowing of the constant current caused to flow by said first constant-current device, a second switching device that turns on or off to allow or block flowing of the constant current caused to flow by said second constant-current device, a first comparison device that compares the output voltage from said amplifier and the first predetermined voltage for outputting a signal of a logic level dependent on a result of the comparison, a second comparison device that compares the output voltage from said amplifier and the second predetermined voltage for outputting a signal of a logic level dependent on a result of the comparison, and a flip-flop that inverts a logic level of an output signal therefrom when it is detected by said first comparison device that the output voltage from said amplifier has increased to reach the first predetermined voltage, or when it is detected by said second comparison device that the output voltage from said amplifier has decreased to reach the second predetermined voltage, whereby said first and second switching devices turn on or off, depending the logic level of the output signal from said flip-flop.

2. A pulse width modulation amplifier as claimed in claim 1, further comprising a clock pulse input terminal that receives a clock pulse externally supplied, and wherein said constant-current value-setting device includes a phase comparison device that compares a phase of the clock pulse inputted via said clock pulse input terminal and a phase of the output signal from said flip-flop, a current-generating device that generates a current such that a direction of flow thereof and a current value thereof depend on a result of the comparison by said phase comparison device, a low-pass filter that integrates the current generated by said current-generating device, and a control device that controls the constant currents that flow from said first and second constant-current devices, according to an output from said low-pass filter.

3. A pulse width modulation amplifier as claimed in claim 2, wherein said changing device comprises a second capacitance element that changes a total capacitance of said low-pass filter, a third switching device that controls whether or not said second capacitance element is to be connected to said low-pass filter, a fourth switching device that controls whether or not an electric charge accumulated in said second capacitance element is to be discharged, and a D-type flip-flop that inverts a logic level of an output signal therefrom in synchronism with a rise of the output signal from said flip-flop, whereby said third and fourth switching devices turn on or off, depending on the logic level of the output signal from said D-type flip-flop.

4. A pulse width modulation amplifier as claimed in claim 2, wherein said changing device comprises fifth and sixth switching devices that control whether or not values of the current in first and second directions generated by said current-generating device are to be changed, and a D-type flip-flop that-inverts a logic level of an output signal therefrom in synchronism with a rise of the output signal from said flip-flop, wherein said fifth and sixth switching devices turn on or off, depending on the logic level of the output signal from said D-type flip-flop.

5. A pulse width modulation amplifier as claimed in claim 2, wherein said control device comprises an FET having a gate thereof supplied with the output from said low-pass filter and a source thereof connected in series to said first and second resistances connected, said control device controlling a current flowing through a drain thereof according to a level of a source-gate bias thereof to thereby control the constant currents that flow from said first and second constant-current devices, and wherein said changing device comprises a seventh switching device that controls whether or not said second resistance is to be short-circuited, and a D flip-flop that inverts a logic level of an output signal therefrom in synchronism with a rise of the output signal from said flip-flop, whereby said seventh switching device turns on or off, depending on the logic level of the output signal from said D flip-flop.

6. A pulse width modulation amplifier comprising:
an input terminal that receives a signal;
a triangular wave-generating device that generates a triangular wave;
a pulse width modulation amplification device that performs pulse width modulation amplification of the signal input via said input terminal based on the triangular wave generated by said triangular wave-generating device; and
an output terminal that outputs the signal subjected to the pulse width modulation amplification by said pulse width modulation amplification device, wherein said triangular wave-generating device comprises an integrating device that includes an amplifier having a signal input terminal and a signal output terminal, and a capacitance element connected between said signal input terminal and said signal output terminal of said amplifier, a first constant-current device that charges said capacitance element such that an output voltage from said amplifier becomes equal to a first predetermined voltage, by causing a constant current to flow through said capacitance element in a predetermined direction, a second constant-current device that discharges said capacitance element such that the output voltage from said amplifier becomes equal to a second predetermined voltage lower than the first predetermined voltage, by causing a constant current to flow through said capacitance element in a direction opposite to the predetermined direction, a constant-current value-setting device that sets values of the constant currents caused to flow by said first and second constant-current devices, a changing device that changes the respective values of the constant currents that are caused to flow through said capacitive element in the predetermined direction and the direction opposite to the predetermined direction, a first switching device that is operable when a value of the constant current caused to flow by said first constant-current device is changed by said changing device, to turn on or off to allow or block flowing of the constant current whose value has been changed, and operable when the value of the constant current caused to flow by said first constant-current device has not been changed by said changing device, to turn on or off to allow or block flowing of the constant current whose value has not been changed, a second switching device that is operable when a value of the constant current caused to flow by said second constant-current device has been changed by said changing device, to turn on or off to allow or block flowing of the constant current whose value has been changed, and operable when the value of the constant current caused to flow by said second constant-current device has not been changed by said changing device, to turn on or off to allow or block flowing of the constant current whose value has not been changed, a first comparison device that compares the output voltage from said amplifier and the first predetermined voltage for outputting a signal of a logic level dependent on a result of the comparison, a second comparison device that compares the output voltage from said amplifier and the second predetermined voltage for outputting a signal of a logic level dependent on a result of the comparison, and a flip-flop that inverts a logic level of an output signal therefrom when it is detected by said first comparison device that the output voltage from said amplifier has increased to reach the first predetermined voltage, or when it is detected by said second comparison device that the output voltage from said amplifier has decreased to reach the second predetermined voltage, whereby said first and second switching devices turn on or off, depending the logic level of the output signal from said flip-flop.

7. A pulse width modulation amplifier as claimed in claim 6, further comprising a clock pulse input terminal that receives a clock pulse externally supplied, and wherein said constant-current value-setting device comprises a phase comparison device that compares a phase of the clock pulse inputted via said clock pulse input terminal and a phase of the output signal from said flip-flop, a current-generating device that generates a current such that a direction of flow thereof and a current value thereof depend on a result of the comparison by said phase comparison device, a low-pass filter that integrates the current generated by said current-generating device, and a control device that controls the constant currents that flow from said first and second constant-current devices, according to an output from said low-pass filter.

8. A pulse width modulation amplifier as claimed in claim 7, wherein said changing device comprises a third constant-current device disposed for connection in parallel with said first constant-current device, a fourth constant-current device disposed for connection in parallel with said second constant-current device, eighth and ninth switching devices that control whether or not the said third and fourth constant-current devices are to be connected to said first and second constant-current devices, respectively, and a D-type flip-flop that inverts a logic level of an output signal therefrom in synchronism with a rise of the output signal from said flip-flop, whereby said seventh switching device turns on or off, depending on the logic level of the output signal from said D-type flip-flop.

* * * * *